United States Patent [19]

Edwards

[11] 4,155,447
[45] May 22, 1979

[54] INTEGRATED CIRCUIT BOARD CARRIER

[75] Inventor: William J. Edwards, West Palm Beach, Fla.

[73] Assignee: Multi-Tool & Manufacturing Inc., Port Canaveral, Fla.

[21] Appl. No.: 881,690

[22] Filed: Feb. 27, 1978

[51] Int. Cl.$^2$ .................... B65D 85/30; B65D 85/62
[52] U.S. Cl. .................................. 206/334; 211/40; 206/454; 206/509
[58] Field of Search ............... 206/334, 328, 454, 455, 206/456, 449, 509, 511; 312/10; 211/40, 41; 108/53.1, 54.1

[56] References Cited

U.S. PATENT DOCUMENTS

| | | | |
|---|---|---|---|
| 2,715,559 | 8/1955 | Villo | 206/509 |
| 2,868,606 | 1/1959 | Stierna | 312/10 |
| 2,950,001 | 8/1960 | Bucko | 206/454 |
| 3,247,424 | 4/1966 | Kossoy et al. | 211/40 |
| 3,977,333 | 8/1976 | Phillips | 108/54.1 |
| 4,029,208 | 6/1977 | Fickler et al. | 206/454 |

Primary Examiner—William T. Dixson, Jr.
Attorney, Agent, or Firm—Eugene F. Malin; Barry L. Haley

[57] ABSTRACT

The carrier includes a top member, a base member and at least two adjustable vertical side members. The vertical side members are adjustable horizontally to vary the width between the side members to accommodate printed circuit boards of varying width. The vertical side members include a plurality of adjustable brackets having a printed circuit board carrying surfaces positioned in a horizontal plane. The brackets are adjustable vertically for accommodating printed circuit boards of varying dimensions.

6 Claims, 6 Drawing Figures

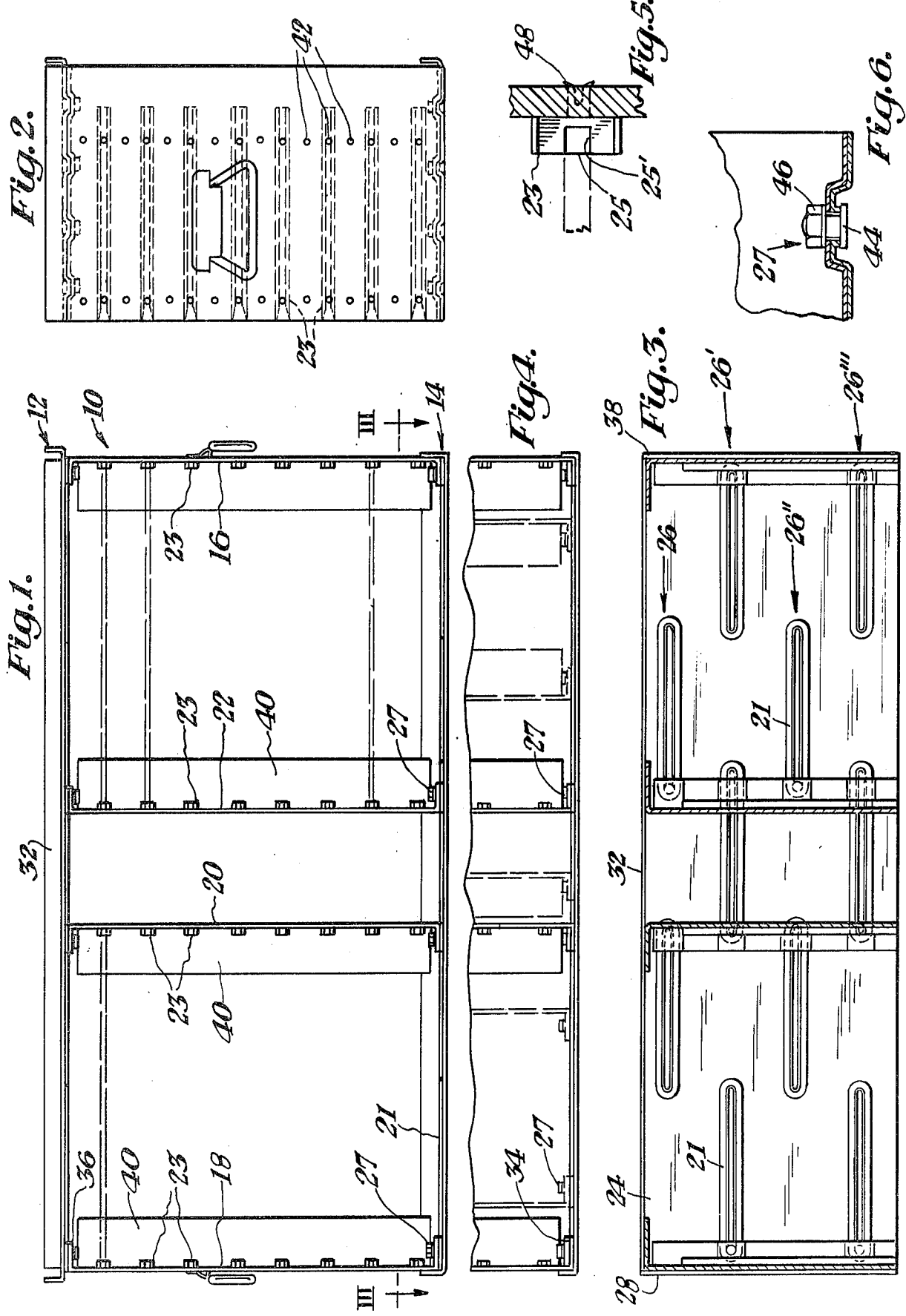

INTEGRATED CIRCUIT BOARD CARRIER

BACKGROUND OF THE INVENTION

Printed circuit board carrier for holding printed circuit boards have been designed in the past. Such printed circuit board carriers include one-piece electronic component module carriers as shown in U.S. Pat. No. 3,652,974 and complex holders as shown in U.S. Pat. No. 3,915,307. In the past such holding devices have not been easily adjustable or relatively inexpensive to manufacture.

SUMMARY OF THE INVENTION

The printed circuit board carrier includes a top member having adjusting means, a base member having adjusting means, at least two adjustable vertical side members and a plurality of adjustable connecting means and attaching means. The vertical side members are adjustable horizontally to vary the spacing between the vertical side members. The adjustable connecting means connect the top member and base member to the vertical side members. Printed circuit boards of varying width are placed between two adjacent vertical side members. The vertical side members include a plurality of vertically adjustable brackets having a carrying groove therein for carrying a printed circuit board. The vertical side members have a plurality of holes therein for connecting the adjustable brackets at various heights by utilizing the releasable attaching means or connecting means. The printed circuit board carrier is therefore adjustable to hold printed circuit boards of varying widths and heights.

The top member and base member may be identically stamped with a plurality of rows of slots, each of which includes a plurality of elongated slots. The top member may be slightly larger in proportion to the base member to allow stacking of the carriers. The vertical side members include upper and lower flanges that are attached by attaching means or connecting means to the elongated slots. The adjustable connecting means are adjustable along the length of the slots.

It is an object of this invention to provide a carrier for holding printed circuit boards of varying heights and widths that is of a non-complex design and is easy to manufacture.

It is another object of this invention to provide a printed circuit board carrier that is easily adjustable in width to hold printed circuit boards of various dimensions.

It is another object of this invention to provide a non-complex, easily adjustable carrier structure for carrying printed circuit boards of various heights and widths that is economical to produce.

In accordance with these and other objects which will be apparent hereinafter, the instant invention will now be described with particular reference to the accompanying drawings.

BRIEF DESCRIPTION OF THE DRAWINGS

FIG. 1 is a front view of one embodiment of the carrier;

FIG. 2 is a side view of the carrier shown in FIG. 1;

FIG. 3 is a cross-sectional view of FIG. 1 taken along lines 3—3 and looking in the direction of the arrow;

FIG. 4 is a partial side view of the carrier shown in FIG. 1 with a phantom illustration of the vertical side members readjusted into other positions;

FIG. 5 is an enlarged view of a vertically adjustable brackets illustrating the holding means; and FIG. 6 is an enlarged view of the connecting means connecting a vertical side member to a base member.

DESCRIPTION OF THE PREFERRED EMBODIMENT

Referring now to the drawing, the printed circuit board carrier 10 shown in FIG. 1 and includes a top member 12, a base member 14 and at least two vertical side members. The vertical side members 16, 18, 20, and 22 are adjustable horizontally to the left or right to vary the width of the spacing between two adjacent vertical side members. The vertical side members 16, 18, 20 and 22 include a plurality of adjustable brackets 23 as shown in FIGS. 1 and 5 having a printed circuit board carrying shelf having a groove therein and holding surface 25. The brackets 23 are moveably positionable in a horizontal plane on the vertical side members. The printed circuit board carrier 10 has adjustable vertical side members and brackets for holding printed circuit boards of varying dimensions such as widths and heights.

The top member 12 and base member 14, may be identical and therefore may be illustrated as a flat member with slots and flanges constructed in a similar manner with the same dies. As shown, the top member 12 is a flat plate with slots and flanges. The base member 14 is a flat plate with depressed portions 21 having slots 38 and with flanges 28 and 30. The top member 12 and base member 14 have a generally planar horizontal portion 24 having a plurality of rows of slots 26, 26' 26", 26'", shown as four rows. Each row contains between two and three slots that lie along a longitudinal, transverse row center line. The rows lie parallel to one another. The slots are utilized to hold connecting means designated by numerals 27 such as a plurality of nuts and bolts that hold the adjustable vertical side vertical side members 16, 18, 20 and 22 in position. When the nuts and bolts are loosened, the adjustable vertical side members may be adjusted to the left or right in the slots as shown in phantom by adjusted vertical side members 16, 18, 20 and 22 in FIG. 4. The slots allow the adjusting connecting means to be moved with the vertical side members for easy adjustment without completely releasing the nut from the bolt. The vertical side members may be moved toward and away from one another to vary the acceptable width for storage of printed circuit boards.

The top member 12 and base member 14 may include side flanges 28 and 30 and a rear flange 32. These flanges add strength to the members. The flanges in another direction may be used to provide legs on the base member. When a second carrier with the base flanges projecting upwardly, not shown, is stacked on top of the carrier shown in FIG. 1, the top member's holding flanges 28, 30 and 32 encompass the base flanges of the second carrier, not shown. The front of the top and base members of the carrier do not include a flange. The front of the carrier provides free access to any printed circuit boards placed in the carrier. The flanges 28, 30 and 32 on the base member may be positioned pointing upwardly with only the depressed portions 21 pointing downward as leg means as shown in FIG. 1.

Each of the adjustable vertical side members illustrated as 16, 18, 20 and 22 include an upper and lower right angle flanges designated by numerals 34 and 36.

Flanges 34 and 36 engage the top member 12 and the base member 14 respectively to provide support and to carry the adjustable connector means shown by numerals 27. An enlarged rear flange 40 is connected to the rear of the vertical side members to provide a back stop member for the printed circuit boards that are slid into the carrier on the adjustable brackets 23. The adjustable brackets are slotted as shown at 25 in FIG. 5 having holes for the connecting means shown by numeral or attaching means 38. The attaching means 38 fit through holes in the adjustable brackets 23 and the selected holes 42 in the vertical members. A plurality of holes 42 shown in FIG. 2 are placed in the vertical side members 16, 18, 20 and 22 to provide for a plurality of vertical bracket positions.

Referring to FIG. 6, the connector means 27 includes bolt 44, washer 45, and nut 46.

It should be noted that the side members may include a vertical board between the rear edge and the brackets to strengthen the carrier. The handles are offset toward the front as shown in FIG. 2 in order that the printed circuit boards in the brackets will be held in by gravity when the carrier is lifted off the floor. The handles may also be connected at an angle to also provide tilting.

In order to keep the printed circuit boards at an angle in the brackets or edge holding means, the front and back openings 42 may be drilled at different levels to connect the brackets at an angle sloping rearwardly.

The brackets may be replaced by louvers formed in the side members through stamping or other methods of making.

Further, when large printed circuit boards are held in the carrier, the end members 16 and 18 may have larger flanges at the top and bottom so the plurality of connectors 27 may be used. If two connectors are used, both will pass through the slots.

The instant invention is shown and described herein what is considered to be the most practical and preferred embodiment. It is recognized, however, that departures may be made therefrom within the scope of the invention and that obvious modifications will occur to a person skilled in the art.

What I claim is:

1. A generally open carrier for printed circuit boards comprising:
    a top member and a base member,
    at least two generally flat planer vertical side members,
    said top member and base member include at least two generally parallel spaced apart rows of elongated slots having their longitudinal length extending transversely across the carrier from side to side,
    said vertical side member including an upper and lower connecting means generally inwardly projecting perpendicular to said vertical side member, releasable connector means connected to said elongated slots in slidable relation therewith and connected to said connecting means for releasably connecting said vertical side member to said top member and said base member in a slidable relation to vary the traverse distance between said vertical side members, and
    a plurality of vertically adjustable horizontal brackets connected to each vertical side member for supporting the printed circuit boards in a horizontal plane between said vertical side members.

2. A printed circuit carrier as set forth in claim 1, wherein:
    said vertical side members include a rear flange for stopping printed circuit boards placed into said carrier from emerging from a generally open rear portion of said carrier.

3. A printed circuit carrier as set forth in claim 2, wherein:
    said connector means pass through openings provided in said upper and lower connecting means of said vertical side members and said elongated slots to allow longitudinal adjustment transversely across said carrier without removal of said vertical side members.

4. A printed circuit carrier as set forth in claim 3 wherein:
    said top member and said base member includes inwardly depressed slot portions surrounding each elongated slot to position said connector means out of contact with the supporting surface.

5. A printed circuit carrier as set forth in claim 1, wherein;
    said brackets include slots for receiving the printed circuit boards.

6. A printed circuit board carrier, comprising:
    a top member and a base member in a fixed parallel relation to each other, said top member and base member having at least two rows of parallel elongated slots extending transversely in a side to side direction;
    at least two generally flat planer vertical side members, said side members having inwardly projecting connecting members perpendicular to said vertical side members and inwardly projecting rear members for stopping printed circuit boards from egressing the rear of said carrier;
    releasable connector means for connecting said top member and said base member in slidable relation to said side walls through apertures in said inwardly projecting connecting members and said elongated slots, and
    a plurality of slotted vertically adjustable horizontal adjustable horizontal brackets connected to said side walls for receiving printed circuit boards.

* * * * *